(12) United States Patent
Takeuchi et al.

(10) Patent No.: US 8,263,686 B2
(45) Date of Patent: Sep. 11, 2012

(54) OPTICAL SEMICONDUCTOR-SEALING COMPOSITION

(75) Inventors: Hideharu Takeuchi, Tsukuba (JP); Kouki Hamata, Tsukuba (JP); Masaki Kobayashi, Tsukuba (JP); Minoru Murata, Tsukuba (JP); Takahiro Koshimizu, Hadano (JP)

(73) Assignee: Arakawa Chemical Industries, Ltd., Osaka-Shi (JP)

( * ) Notice: Subject to any disclaimer, the term of this patent is extended or adjusted under 35 U.S.C. 154(b) by 481 days.

(21) Appl. No.: 12/600,442

(22) PCT Filed: Jul. 1, 2008

(86) PCT No.: PCT/JP2008/061881
§ 371 (c)(1),
(2), (4) Date: Nov. 16, 2009

(87) PCT Pub. No.: WO2009/008283
PCT Pub. Date: Jan. 15, 2009

(65) Prior Publication Data
US 2010/0171146 A1    Jul. 8, 2010

(30) Foreign Application Priority Data

Jul. 10, 2007  (JP) ................ 2007-180582
Jan. 25, 2008  (JP) ................ 2008-014734

(51) Int. Cl.
*C08K 9/06* (2006.01)
(52) U.S. Cl. ..................... 523/212; 428/405
(58) Field of Classification Search ............ 523/212; 428/405
See application file for complete search history.

(56) References Cited

U.S. PATENT DOCUMENTS

| 4,043,969 A * | 8/1977 | Sporck .................. 523/213 |
| 5,939,472 A * | 8/1999 | Ito et al. ................. 523/433 |
| 2012/0052289 A1 * | 3/2012 | Jing et al. .............. 428/331 |

FOREIGN PATENT DOCUMENTS

| JP | 4-103618 A | 4/1992 |
| JP | 6-89948 A | 3/1994 |
| JP | 6-232296 A | 8/1994 |
| JP | 06-302726 | 10/1994 |
| JP | 11-74424 A | 3/1999 |
| JP | 2005-225964 A | 8/2005 |
| JP | 2005-247904 A | 9/2005 |
| JP | 2006-256874 A | 9/2006 |
| JP | 2008-63551 A | 3/2008 |

* cited by examiner

*Primary Examiner* — Margaret Moore
(74) *Attorney, Agent, or Firm* — Birch, Stewart, Kolasch & Birch, LLP

(57) ABSTRACT

The present invention provides an optical semiconductor encapsulating composition comprising (A) an epoxy compound, (B) a carboxylic anhydride curing agent, (C) a curing accelerator, and (D) surface-coated silica particles having an average particle diameter of 5 to 50 nm in which 0.2 to 3 mmol of a silane coupling agent (D2) that contains an epoxy group-containing silane coupling agent (d1) is reacted with 1 g of silica particles (D1) to surface-coat the silica particles, the epoxy group being converted into a hydroxyl group through ring opening; and an optical semiconductor device in which an optical semiconductor is encapsulated with the composition.

10 Claims, No Drawings

OPTICAL SEMICONDUCTOR-SEALING COMPOSITION

TECHNICAL FIELD

The present invention relates to an optical semiconductor encapsulating composition.

BACKGROUND ART

For an optical semiconductor encapsulating resin composition for use in the production of optical semiconductor devices such as light emitting diodes (LEDs), a transparent epoxy resin composition that is obtained using an epoxy resin, such as a bisphenol A epoxy resin and an alicyclic epoxy resin, in combination with an acid anhydride as a curing agent is generally used.

In optical semiconductor devices such as LEDs in which an epoxy resin composition is used as an encapsulating resin, internal stress is generated by the contraction that occurs during the curing of the epoxy resin composition and by the distortion that results from the difference between the linear thermal expansion coefficients of the epoxy resin and an optical semiconductor (such as an (LED chip), lead frame or the like. Moreover, long-term use of an LED results in gradual property deterioration due to the change of its environmental conditions, causing problems such as the breaking of the cured product of the epoxy resin used as an encapsulating agent and the reduction of the luminance thereof. Such deterioration is evaluated in terms of heat cycle resistance, which indicates the durability of LEDs in a heat shock test.

For a method to reduce the internal stress of an LED, a method in which inorganic powders such as silica powder are added to an epoxy resin composition to reduce the linear thermal expansion coefficient of the composition to be close to that of a LED chip or the like is performed. This method, however, is problematic in that, although internal stress is reduced, transparency is impaired because large amounts of inorganic powders are required to adjust the linear thermal expansion coefficient to be close to that of an LED chip or the like.

In order to address the above-described problem, Patent Literature 1 proposes a method for enhancing the transparency of an epoxy resin composition by adding silica powder that is surface-treated with a silane coupling agent to minimize the difference between the refractive indices of the silica powder and the cured product of the epoxy resin composition. In addition, Patent Literature 2 discloses a method for enhancing the transparency of an epoxy resin composition by adding silica particles having a particle diameter of 0.06 μm or less, which is shorter than the wavelength of light. Furthermore, Patent Literature 3 discloses a method for enhancing the transparency and the heat resistance by treating at high temperatures silica particles that are added to an epoxy resin composition or surface-treating them with hexamethyldisilazane or a silane coupling agent to decrease the hydroxyl groups on the particle surface and to adjust the particle diameter thereof to 0.1 μm or less.

The aforementioned methods are, however, all problematic in that the transparency of a cured product is still insufficient and the cured product readily undergoes cracking during a heat shock test, exhibiting inferior heat cycle resistance, because the dispersion stability of silica powder in the epoxy resin composition is poor and silica particles that are in an agglomerated state are present.

Therefore, a great demand exists for an epoxy resin composition for encapsulating an optical semiconductor, the cured product of which has high transparency, i.e., high light transmittance, and excellent heat cycle resistance.

Patent Literature 1: JP 11-74424A
Patent Literature 2: JP 06-302726 A
Patent Literature 3: Japanese Patent No. 3017888

DISCLOSURE OF INVENTION

Problem to be Solved by the Invention

An object of the present invention is to provide an optical semiconductor encapsulating composition with which a cured product having a good light transmittance in a broad temperature range and an excellent heat cycle resistance is obtained.

Means for Solving Problem

The inventors conducted extensive research to address the problems described above. As a result, the inventors have found that silica particles of a specific average particle diameter that have undergone a surface coating treatment using a silane coupling agent that contains an epoxy group-containing silane coupling agent whose epoxy group is converted into a hydroxyl group through ring opening during the surface coating exhibit excellent dispersion stability in an epoxy resin composition and barely produce particles that are in an agglomerated state and, therefore, a cured product exhibits sufficient transparency and small internal stress, does not crack during a heat shock test, and has an excellent heat cycle resistance. The present invention was accomplished based on this finding.

The present invention provides optical semiconductor encapsulating compositions and optical semiconductor devices as described below.

Item 1. An optical semiconductor encapsulating composition comprising:
(A) an epoxy compound,
(B) a carboxylic anhydride curing agent,
(C) a curing accelerator, and
(D) surface-coated silica particles having an average particle diameter of 5 to 50 nm in which 0.2 to 3 mmol of a silane coupling agent (D2) that contains an epoxy group-containing silane coupling agent (d1) is reacted with 1 g of silica particles (D1) to surface-coat the silica particles, the epoxy group being converted into a hydroxyl group through ring opening.

Item 2. The optical semiconductor encapsulating composition according to Item 1, wherein the component (A) is an alicyclic epoxy resin.

Item 3. The optical semiconductor encapsulating composition according to Item 1, wherein the silane coupling agent (D2) contains the epoxy group-containing silane coupling agent (D1) in a proportion of 20 to 100 mol %.

Item 4. The optical semiconductor encapsulating composition according to Item 1, wherein the reaction of the silica particles (D1) and the silane coupling agent (D2) is performed under an acidic condition.

Item 5. The optical semiconductor encapsulating composition according to Item 1, wherein the amount of the component (B) is such that the equivalent of the component (B) per equivalent of the component (A) is 0.5 to 1.5 eq.

Item 6. The optical semiconductor encapsulating composition according to Item 1, wherein the amount of the component (C) is 0.01 to 8.0 parts by weight per 100 parts by weight of the component (A).

Item 7. The optical semiconductor encapsulating composition according to Item 1, wherein the amount of the component (D) is 3 to 70 parts by weight per 100 parts by weight of the component (A).

Item 8. The optical semiconductor encapsulating composition according to Item 1 for use in a light emitting diode chip optical semiconductor.

Item 9. An optical semiconductor device in which an optical semiconductor is encapsulated with the optical semiconductor encapsulating composition of Item 1.

Item 10. The optical semiconductor device according to Item 9 containing a light emitting diode chip optical semiconductor.

Optical Semiconductor Encapsulating Composition

The optical semiconductor encapsulating composition of the present invention is an epoxy resin composition comprising as essential components an epoxy compound (A), a carboxylic anhydride curing agent (B), a curing accelerator (C), and specific surface-coated silica particles (D).

Epoxy Compound (A)

The epoxy compound (A) is not particularly limited insofar it is a compound having at least one epoxy group, and known compounds can be used. Specific examples include bisphenol-type epoxy resins such as a bisphenol A epoxy resin, a bisphenol F epoxy resin, and a bisphenol S epoxy resin; novolak-type epoxy resins such as a phenol novolak epoxy resin and a cresol novolak epoxy resin; alicyclic epoxy resins; epoxy resins having a nitrogen-containing ring, such as a hydantoin epoxy resin; aliphatic epoxy resins; glycidyl ether-type epoxy resins; biphenyl-type epoxy resins; Bicyclic epoxy resins; naphthalene-type epoxy resins; and the like. Such epoxy compounds may be used singly or in combination of two or more.

Among such epoxy compounds, in terms of having excellent transparency and coloring resistance, a bisphenol A epoxy resin, a bisphenol F epoxy resin, a phenol novolak epoxy resin, a cresol novolak epoxy resin, an alicyclic epoxy resin, and the like are preferable, with an alicyclic epoxy resin being particularly preferable.

A hydrogenated epoxy resin, an epoxy resin obtained by epoxidizing an alicyclic olefin, or the like may be used as an alicyclic epoxy resin.

Examples of hydrogenated epoxy resins include a hydrogenated bisphenolA epoxy resin, a hydrogenated bisphenol F epoxy resin, a hydrogenated biphenol epoxy resin, a hydrogenated phenol novolak epoxy resin, a hydrogenated cresol novolak epoxy resin, a hydrogenated bisphenol A novolak epoxy resin, a hydrogenated naphthalene diol epoxy resin, a hydrogenated phenol dicyclopentadiene novolak epoxy resin, and the like.

Moreover, examples of epoxy resins obtained by epoxidizing an alicyclic olefin include 3,4-epoxycyclohexylmethyl-3',4'-epoxycyclohexane carboxylate, 1,2-epoxy-vinylcyclohexene, bis(3,4-epoxycyclohexylmethyl)adipate, 1-epoxyethyl-3,4-epoxycyclohexane, 1,2:8,9-diepoxylimonene, 3,4-epoxycyclohexylmethanol, dicyclopentadiene diepoxide, an oligomeric alicyclic epoxy resin, a 1,2-epoxy-4-(2-oxiranyl)cyclohexane adduct of 2,2-bis(hydroxymethyl)-1-butanol (for example, trade name "EHPE-3150", manufactured by Daicel Chemical Industries, Ltd.), and the like. Examples of oligomeric alicyclic epoxy resins include epoxidized tetrakis(3-cyclohexenylmethyl) butanetetracarboxylate-modified ε-caprolactone (for example, trade name "Epolead GT401", manufactured by Daicel Chemical Industries, Ltd.), and the like.

For alicyclic epoxy resins, a hydrogenated bisphenol A epoxy resin, a hydrogenated bisphenol F epoxy resin, a hydrogenated biphenol epoxy resin, 3,4-epoxycyclohexylmethyl-3',4'-epoxycyclohexane carboxylate, and the like are particularly preferable since they are in a liquid state at ordinary temperature and it is thus easy to handle.

Carboxylic Anhydride Curing Agent (B)

The carboxylic anhydride curing agent (B) is not particularly limited insofar as it can cure the component (A), and known curing agents can be used. Specific examples include carboxylic anhydrides such as phthalic anhydride, maleic anhydride, trimellitic anhydride, pyromellitic anhydride, hexahydrophthalic anhydride, tetrahydrophthalic anhydride, nadic methyl anhydride, nadic anhydride, glutaric anhydride, methylhexahydrophthalic anhydride, and methyltetrahydrophthalic anhydride. Such carboxylic anhydrides may be used singly or in a combination of two or more.

Among such carboxylic anhydrides, it is preferable to use phthalic anhydride, hexahydrophthalic anhydride, tetrahydrophthalic anhydride, methylhexahydrophthalic anhydride, and the like.

The amount of the carboxylic anhydride curing agent (B) to be used is not particularly limited, and it is usually preferable such that the component (B) is in an amount of about 0.5 to 1.5 eq., and more preferably about 0.7 to 1.2 eq., per equivalent of the epoxy compound (A). When the amount of the component (B) is less than 0.5 eq., the curing rate of the optical semiconductor encapsulating epoxy resin composition is likely to be slow, while when it exceeds 1.5 eq., the moisture resistance of a cured product is likely to be impaired.

Curing Accelerator (C)

The curing accelerator (C) is not particularly limited insofar as it facilitates the curing reaction of the component (A) and the component (B), and known materials can be used. Specific examples include tertiary amines such as benzyldimethylamine, 2,4,6-tris(dimethylaminomethyl)phenol, and dimethylcyclohexylamine; imidazoles such as 1-cyanoethyl-2-ethyl-4-methylimidazole and 2-ethyl-4-methylimidazole; organophosphorous compounds such as triphenyl phosphine and triphenyl phosphite; quarternary phosphonium salts such as tetra-n-butylphosphonium o,o-diethylphosphorodithioate, tetraphenylphosphonium bromide, and tetra-n-butylphosphonium bromide; diazabicycloalkenes such as 1,8-diazabicyclo[5,4,0]undecene-7, and organic acid salts thereof; organometallic compounds such as zinc octoate, tin octoate, and an aluminium acetylacetone complex; quarternary ammonium salts such as tetraethylammonium bromide, and tetra-n-butylammonium bromide; boron compounds such as boron trifluoride, and triphenyl borate; metal halogenate compounds such as zinc chloride and stannic chloride; and the like. Other examples include latent curing accelerators such as high-melting dispersion-type latent curing accelerators such as amine-added curing accelerators, e.g., an adduct of dicyandiamide or amine and an epoxy resin; microcapsule-type latent curing accelerators in which the surface of a curing accelerator such as an imidazolic curing accelerator, a phosphorous curing accelerator, and a phosphine curing accelerator is polymer-coated; amine salt-type latent curing accelerators; high-temperature dissociative, thermal cationic polymerization-type latent curing accelerators such as a Lewis acid salt and a Bronsted acid salt; and the like.

Such curing accelerators may be used singly or in a combination of two or more.

The amount of the curing accelerator (C) to be used is not limited, and it is preferably about 0.01 to 8.0 parts by weight, and more preferably about 0.1 to 3.0 parts by weight, per 100 parts by weight of the epoxy compound (A). When the amount is less than 0.01 parts by weight, sufficient curing acceleration may not be attained, and when it exceeds 8.0 parts by weight, a cured product may be colored.

Surface Coated Silica Particles (D)

Since the composition of the present invention comprises surface-coated silica particles (D) having an average particle diameter of 5 to 50 nm in which 0.2 to 3 mmol of a silane coupling agent (D2) that contains an epoxy group-containing silane coupling agent (D1) is reacted with 1 g of silica particles (D1) to surface-coat the silica particles, the epoxy group being converted into a hydroxyl group through ring opening during the surface coating, a cured product exhibits sufficient transparency and small internal stress and has an excellent heat cycle resistance.

The amount of the silane coupling agent (D2) for reaction (the amount for surface coating) being less then 0.2 mmol is not preferable because the dispersion stability of the surface-coated silica particles (D) in the resulting optical semiconductor encapsulating composition is impaired, and the transparency and the heat cycle resistance of a cured product are deteriorated. On the other hand, the amount of the silane coupling agent (D2) for reaction (the amount for surface coating) exceeding 3 mmol is not preferable because coated silica particles bind each other, the dispersion stability of the surface-coated silica particles (D) in the composition is likewise impaired, and the transparency and the heat cycle resistance of a cured product are deteriorated.

The proportion of the silane coupling agent (D2) for reaction with 1 g of the silica particles (D1) is preferably about 0.4 to 2.5 mmol.

Here, the amount for reaction (the amount for surface coating) is a value determined by comparing the weight difference between surface-uncoated silica particles and surface-coated silica particles by a thermogravimetry (TG) analysis.

Moreover, it is necessary to convert the epoxy group in the silane coupling agent (D2) of the surface coating layer into a hydroxyl group through ring opening. It is not preferable not to achieve the conversion into a hydroxyl group because the dispersion stability of the surface-coated silica particles (D) in the resulting optical semiconductor encapsulating composition is impaired, and the transparency and the heat cycle resistance of a cured product are deteriorated.

Furthermore, it is necessary to use particles having an average particle diameter of 5 to 50 nm for the surface-coated silica particles (D). When the average particle diameter of the silica particles (D) exceeds 50 nm, the transparency of the resulting cured product may be impaired. It is preferable to use particles having an average particle diameter of about 5 to 40 nm for the silica particles (D). The average particle diameter as used herein refers to a value measured according to dynamic light scattering.

The silica particles (D1) are not particularly limited, and known silica particles can be used. Specific examples for use include those that are synthesized by the polycondensation of sodium silicate, those that are synthesized by hydrolyzing alkoxysilanes in aqueous alcoholic solutions, and the like.

Commercially available silica particles may be used for the silica particles (D1). Examples of commercially available products (trade names) in the form of a silica particle dispersion in which particles are dispersed in a water-miscible organic solvent include "Methanol Silica Sol", "IPA-ST", "MEK-ST", "XBA-ST", "DMAC-ST", "ST-20", "ST-40", "ST-C", "ST-N", "ST-O", "ST-50", "ST-OL" (these are manufactured by Nissan Chemical Industries, Ltd.); "Organosol PL-2L-MA", "Organosol PL-2L-IPA", "Organosol PL-2PGME" (these are manufactured by Fuso Chemical Co., Ltd.); and the like. Examples in the form of a silica particle include "Aerosil 130", "Aerosil 300", "Aerosil 380", "Aerosil TT600", "Aerosil OX50" (these are manufactured from Nippon Aerosil Co., Ltd.); "Sildex H31", "Sildex H32", "Sildex H51", "Sildex H52", "Sildex H121", "Sildex H122" (these are manufactured by Asahi Glass Co., Ltd.; "E220A", "E220" (these are manufactured by Nihon Silica Kogyo; "Sylysia 470" (manufactured by Fuji Silysia Chemical Ltd.); "SG Flake" (manufactured by Nippon Sheet Glass Co., Ltd.); and the like.

In addition, for the silica particles (D1), a mixture of a silica particle dispersion in which particles are dispersed in a water-miscible organic solvent and a silica particle dispersion in which particles are dispersed in water; a silica particle dispersion in which a water-miscible organic solvent is added to a silica particle dispersion in which particles are dispersed in water; and the like can also be used. Examples of silica particle dispersions in which particles are dispersed in water may include the Snowtex series (manufactured by Nissan Chemical Industries, Ltd.), the Silicadol series (manufactured by Nippon Chemical Industrial Co., Ltd.), the Cataloid series (manufactured by Catalysts and Chemicals Ltd.), and the like.

A silane coupling agent is usually an organic silicon compound that has within its molecule a functional group reactive with an organic material and a functional group reactive with an inorganic material. In the present invention, the epoxy group-containing silane coupling agent (d1) or a mixture of the silane coupling agent (d1) and another silane coupling agent (d2) is for use as the silane coupling agent (D2).

The amount of the epoxy group-containing silane coupling agent (d1) in the silane coupling agent (D2) is preferably about 20 to 100 mol % because the resulting surface-coated silica particles (D) are sufficiently highly firmly fixed to the epoxy resin matrix of a cured product. When the amount of the silane coupling agent (d1) is less than 20 mol %, the strength with which the surface-coated silica particles (D) is fixed to the matrix is likely to be insufficient.

The epoxy group-containing silane coupling agent (d1) is not particularly limited, and known materials can be used. Specifically, for example, a compound represented by General Formula (1) can be used:

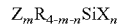

$$Z_m R_{4-m-n} SiX_n$$

wherein Z represents a hydrocarbon group having an epoxy group, R represents a hydrocarbon group, X represents a hydrolytic group, m represents 1, and n represents 1, 2 or 3.

Examples of the hydrocarbon group having an epoxy group represented by Z include a 2-glycidoxyethyl group, a 3-glycidoxypropyl group, a 4-glycidoxybutyl group, a 2-(3,4-epoxycyclohexyl)ethyl group, a 3-(3,4-epoxycyclohexyl)propyl group, and the like. Examples of the hydrocarbon group represented by R include a methyl group, an ethyl group, a propyl group, a butyl group, a hexyl group, a phenyl group, and the like. Moreover, examples of the hydrolytic group represented by X include an alkoxy group, a halogen group, an acetoxy group, and the like.

Specific examples of the silane coupling agent (d1) represented by General Formula (1) include 3-glycidoxypropyltrimethoxysilane, 2-(3,4-epoxycyclo hexyl)ethyltrimethoxysilane, 3-glycidoxypropyl methyldimetoxysilane, 3-glycidoxypropyl methyldiethoxysilane, 3-glycidoxypropyltriethoxysilane, and the like. Among such examples, use of a silane coupling agent that has an epoxy group and a trialkoxysilyl group is particularly preferable because the surface-coated silica particles (D) are sufficiently highly firmly fixed to the epoxy resin matrix of a cured product.

For example, a compound represented by General Formula (2):

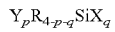

$$Y_p R_{4-p-q} SiX_q$$

wherein Y represents an alkyl group having a (meth)acryloxy group, an alkyl group having an amino group, an aminoalkylamino group, a dialkylamino group or a phenylamino group, an alkyl group having a mercapto group, an alkyl group having a halogen group, a vinyl group, or an allyl group; R represents a hydrocarbon group; X represents a hydrolytic group; p represents 0, 1 or 2; and q represents 1, 2 or 3, provided that p+q≦4, can be used as the other silane coupling agent (d2) that is different from the epoxy group-containing silane coupling agent (d1).

Examples of the alkyl group having a (meth)acryloxy group represented by Y include a 3-methacryloxypropyl group, a 3-acryloxyprophyl group, and the like. Examples of the alkyl group having an amino group, an aminoalkylamino group, a dialkylamino group or a phenylamino group represented by Y include an aminoethyl group, a 3-aminopropyl group, a 3-(2-aminoethylamino)propyl group, an N,N-dimethylaminopropyl group, an N-phenyl-3-aminopropyl group, and the like. Examples of the alkyl group having a mercapto group represented by Y include a 3-mercaptopropyl group and the like. Examples of the hydrocarbon group represented by R and the hydrolytic group represented by X are both as described above.

Specific examples of the silane coupling agent (D2) represented by General Formula (2) include 3-methacryloxypropyl methyldimethoxysilane, 3-methacryloxypropyltrimethoxysilane, 3-methacryloxypropylmethyldiethoxysilane, 3-methacryloxypropyltriethoxysilane, 3-(2-aminoethyl amino)propylmethyldimethoxysilane, 3-(2-aminoethylamino) propyltrimethoxysilane, 3-(2-aminoethylamino) propyltriethoxysilane, 3-aminopropyltrimethoxysilane, 3-amino propyltriethoxysilane, N-phenyl-3-aminopropyltrimethoxysilane, 3-mercaptopropyltrimethoxysilane, hexyltrimethoxysilane, methyltrichlorosilane, methyldichlorosilane, dimethyldichlorosilane, trimethylchlorosilane, phenyltrichlorosilane, diphenyldichlorosilane, vinyltrichlorosilane, trimethylbromosilane, and the like.

A method for reacting the silica particles (D1) and the silane coupling agent (D2) is not particularly limited, and a known method may be adopted. A specific example adopted is a method in which the silane coupling agent (D2) is reacted with the silica particles (D1) under acidic conditions and, if necessary, under heating, using a water-miscible organic solvent or a mixture of a water-miscible organic solvent and water as a reaction medium, or a like method. Due to the reaction performed under acidic conditions, the surface of the silica particles (D1) is coated with the silane coupling agent (D2) and, at the same time, the epoxy group contained in the coated layer is hydrolyzed and converted into a hydroxyl group. The resulting silica particles (D) having a hydroxyl group in the coated surface layer exhibit excellent dispersion stability in the composition of the present invention and barely create particles that are in an agglomerated state, and thus the transparency and the heat cycle resistance of a cured product are superior. In addition, the surface-coated silica particles (D) having a hydroxyl group are sufficiently highly firmly fixed to the epoxy resin matrix of a cured product.

When the silane coupling agent (D2) is reacted with the silica particles (D1) under acidic conditions, it is preferable to use an acid catalyst of sulfuric acid, nitric acid, formic acid, acetic acid, or the like. However, when the silica particles (D1) are in the form of a silica particle dispersion in which particles are dispersed in a water-miscible organic solvent or a mixed solvent of water and a water-miscible organic solvent, it is not always necessarily to add an acid catalyst if the silica particle dispersion is acidic.

The conditions of the above-described reaction of the silica particles (D1) and the silane coupling agent (D2) include an acidity of less than pH 7, preferably a pH of about 2 to 6; a reaction temperature of about 10 to 150° C., preferably about 30 to 140° C.; and a reaction time of about 1 to 15 hours, and preferably about 2 to 12 hours.

Preferable examples of the water-miscible organic solvent include alcohols such as methanol, ethanol, i-propanol, n-butanol, n-octanol, ethyleneglycol monomethyl ether, ethyleneglycol monoethyl ether, diethyleneglycol mono-n-butyl ether, propyleneglycol monomethyl ether, and propylene glycol monoethyl ether; ketones such as acetone and methyl ethyl ketone; and the like.

A reaction fluid obtained by thermally reacting the silica particles (D1) with the silane coupling agents (D2) under acidic conditions can be used as-is as a dispersion of the surface-coated silica particles (D). However, when the reaction fluid is acidic, it is preferable to use the fluid as a dispersion of the surface-coated silica particles (D) after subjecting the fluid to a neutralizing treatment with an ion exchange resin; an alkaline substance such as potassium hydroxide or sodium hydroxide; an acid adsorber; or the like. Moreover, these dispersions may be used after being converted into a powdery form by distilling off the water and the organic solvent therefrom.

Alternatively, the surface-coated silica particles (D) can be used also as a dispersion in which particles are dispersed in a suitable solvent if necessary. Such a solvent is not particularly limited insofar as it is inert against the respective constituents of the composition of the present invention and inert in the curing reaction and has suitable volatility. Specific examples include ketones such as acetone, methyl ethyl ketone, methyl isobutyl ketone, and cyclohexanone; esters such as ethyl acetate, n-butyl acetate, ethyl lactate, propyleneglycol monomethyl ether acetate, and propyleneglycol monoethyl ether acetate; lactones such as γ-butyrolactone; aromatic hydrocarbons such as benzene, toluene, and xylene; amides such as dimethylformamide and dimethylacetamide; lactams such as N-methylpyrrolidone; and the like. Such solvents may be used singly or in a combination of two or more.

When the surface-coated silica particles (D) are used in the form of a dispersion. The solids concentration of the particles (D) is usually preferably about 1 to 60 wt % and more preferably about 5 to 50 wt %.

The amount of the surface-coated silica particles (D) to be used is not particularly limited, and it is usually preferably about 3 to 70 parts by weight and more preferably about 5 to 60 parts by weight per 100 parts by weight of the epoxy compound (A). When the amount of the component (D) used is less than 3 parts by weight, sufficient heat cycle resistance may not be obtained, while when it exceeds 70 parts by weight, the composition may thicken, making it difficult to perform processing.

Preparation of Optical Semiconductor Encapsulating Composition

The optical semiconductor encapsulating composition of the present invention can be prepared by, for example, mixing each of the aforementioned essential components (A) to (D) and an additive that may be added if necessary. Mixing may be performed using a conventional means such as a mixer or a stirrer equipped with a stirring blade. The order of mixing is, for example, dispersing in the component (A) the component (D) that is obtained as a dispersion, distilling off the water and the organic solvent contained therein, and then mixing therewith the component (B), the component (C), and if needed an additive. This order is preferable for enhancing storage stability.

When the optical semiconductor encapsulating composition of the present invention is in the form of a liquid, it may be used as a so-called two-component type, i.e., a mixture containing the epoxy compound (A) and a mixture containing the carboxylic anhydride curing agent (B) are each stored separately and mixed immediately before use. In this case, the component (C), the component (D), and the optional additive component may be mixed in either of the aforementioned mixtures.

A known material that is for use in an epoxy resin composition of this type can be used as the optional additive component of the composition of the present invention. Examples of the additive include deterioration inhibitors, modifying agents, coupling agents, carbon dioxide inhibitors, flexibilizers, impact resistance improvers, oxidation inhibitors, plasticizers, lubricants, flame retardants, antistatic agents, ion trapping agents, tribological modifiers, thixotropic agents, surface tension reducing agents, antifoaming agents, antisettling agents, ultraviolet absorbers, antioxidants, fluorescence agents, coloring agents, electroconductive fillers, defoaming agents, leveling agents, mold release agents, dyes, pigments, and the like.

Examples of the deterioration inhibitors include phenolic compounds, amine compounds, organic sulfur compounds, phosphine compounds, and the like. Examples of the modifying agents include those that are reactive with an epoxy group, such as glycols, silicones and alcohols, and the like. Examples of the coupling agents include the aforementioned silane coupling agents; titanate coupling agents such as titanium stearate and diisopropoxytitanium diisostearate; and the like. Examples of the defoaming agents include silicone defoaming agents and the like. Examples of the carbon dioxide inhibitors include aliphatic polyols such as ethylene glycol and propylene glycol; aliphatic or aromatic carboxylic acids; phenolic compounds; and the like. Examples of the flexibilizers include polyalkylene glycols, polydimethylsiloxane derivatives, and the like. Examples of the impact resistance improvers include rubbers of various kinds, organic polymer beads, and the like.

The optical semiconductor encapsulating composition of the present invention thus obtained can be suitably used for encapsulating optical semiconductors such as LED chips. That is, an optical semiconductor device can be obtained by encapsulating an optical semiconductor with the optical semiconductor encapsulating composition of the present invention. When the optical semiconductor to be encapsulated is an LED chip, an LED can be obtained as the optical semiconductor device.

Encapsulation of an optical semiconductor with the optical semiconductor encapsulating composition of the present invention can be performed according to a known molding method such as transfer molding or casting.

Effects of the Invention

According to the present invention, noteworthy effects as described below are provided.

(1) With the optical semiconductor encapsulating composition of the present invention, a cured product that exhibits good light transmittance usually in a broad temperature range of about −50 to +120° C. and that has excellent heat cycle resistance can be obtained.

The reason that the above-described effects are obtained is believed to be due to the fact that the silica particles (D) contained in the composition of the present invention that have a specific average particle diameter and that have undergone a specific surface coating treatment have excellent dispersion stability in the composition and hardly produce particles that are in an agglomerated state and, therefore, a cured product exhibits sufficient transparency and small internal stress, does not crack during a heat shock test, and has excellent heat cycle resistance.

(2) Therefore, optical semiconductor devices such as light emitting diodes obtained with the optical semiconductor encapsulating composition of the present invention are extremely bright, long lasting, and reliable.

BEST MODE OF CARRYING OUT THE INVENTION

Hereinbelow, the present invention shall be described in more detail with reference to Production Examples, Examples, and Comparative Examples. The present invention, however, is not limited by any of these examples. In Production Examples 1 to 7, the measurements of pH, average particle diameter, and the amount of surface coating were performed according to the following methods.

Method for Measuring pH

A dispersion of surface-coated silica particles was diluted with ion exchange water to attain a concentration of the silica particles of 1% and subjected to a measurement using a pH meter (trade name "D-52", manufactured by Horiba Ltd.).

Method for Measuring Average Particle Diameter

The average particle diameter of silica particles after a coating treatment was measured with a commercially available dynamic light scattering apparatus (trade name "FPAR-3", manufactured by Otsuka Electronics Co., Ltd.) according to a cumulant analysis method using a concentrated solution-type probe.

Method for Measuring the Amount of Surface Coating

Silica particles were agglomerated by adding n-hexane to an isopropanol dispersion of silica particles obtained after a surface coating treatment. Next, this dispersion was processed in a centrifuge (3000 rpm, 30 min) to precipitate the silica particles. A supernatant liquid was removed, and then tetrahydrofuran was added to the residue to disperse the silica particles, and further n-hexane was added to agglomerate the silica particles. This procedure was repeated. Gas chromatography demonstrated that no silane coupling agent that did not react with the silica particle surface remained in the supernatant liquid.

The silica particles were dried at 105° C. for 3 hours with a dryer. A thermogravimetry (TG) analysis of the resulting dried silica particles was performed by heating the particles to 800° C. using a thermogravimetry analyzer (trade name "TG-DTA 2000S", manufactured by Bruker AXS). The amount (mmol) of the coupling agent reacted per gram of the silica particles was calculated by comparison with the amount of the surface-untreated silica particles lost when heated.

Preparation of Surface-Coated Silica Particle Dispersion

PRODUCTION EXAMPLE 1

300 g of silica sol (manufactured by Nissan Chemical Industries, Ltd., trade name "IPA-ST", silica particle solids content: 30%), 0.5 g of concentrated sulfuric acid, 11 g of deionized water, and 331.7 g of isopropyl alcohol were introduced into a 4-neck round-bottomed flask equipped with a stirrer, a stirring blade, a condenser, a dropping funnel, a thermometer and a nitrogen line, and heated to 80° C. while stirring under a nitrogen stream. Next, a solution prepared by dissolving 42.5 g of 3-glycidoxypropyltrimethoxysilane (manufactured by Shin-Etsu Chemical Co., Ltd., trade name "KBM-403") in 272 g of isopropyl alcohol was added dropwise over 1 hour. After the dropwise addition, a surface coating treatment for the silica particles was performed by maintaining the temperature at 80° C. for 6 hours under reflux. The fact that the epoxy groups had been all hydrolyzed under these conditions and converted into hydroxyl groups was confirmed by referring to the result obtained under conditions where no silica sol was added.

820 g of the resulting surface-coated silica particle dispersion was passed through a column filled with 400 ml of an anion exchange resin (manufactured by Organo Corporation, trade name "Amberlite 402J OH") at a rate of 5 ml/min to remove sulfuric acid that was used as a catalyst. In this way, a surface-coated silica particle dispersion in which the surface-coated silica particles had an average particle diameter of 17 nm, an amount of coating of 1.6 mmol/g, and a pH of 7.5 was obtained.

PRODUCTION EXAMPLES 2 to 7

Surface-coated silica particle dispersions were obtained in the same manner as in Production Example 1 except that the type and/or the amount of silane coupling agent used in Production Example 1 were changed as shown in Table 1.

The average particle diameter and the amount of coating of the surface-coated silica particles as well as the pH of the surface-coated silica particle dispersions are shown in Table 1.

TABLE 1

| | Production Example | | | | | | |
|---|---|---|---|---|---|---|---|
| | 1 | 2 | 3 | 4 | 5 | 6 | 7 |
| Silane coupling agent (molar ratio) | A | A | A | B | A/C (20/80) | A/C (10/90) | C |
| Amount (mmol/g) | 2.0 | 0.19 | 4.2 | 2.0 | 2.0 | 2.0 | 2.0 |
| Average particle diameter (nm) | 17 | 21 | 24 | 25 | 24 | 26 | 25 |
| Amount of surface coating (mmol/g) | 1.6 | 0.15 | 3.5 | 1.6 | 0.8 | 0.6 | 0.6 |
| pH of dispersion | 7.5 | 7.6 | 7.6 | 7.8 | 7.0 | 6.8 | 7.2 |

In Table 1, in the row for silane coupling agents, A indicates 3-glycidoxypropyltrimethoxysilane, B indicates 2-(3,4-epoxycyclohexyl)ethyltrimethoxysilane, and C indicates hexyltrimethoxysilane.

Preparation of Epoxy Resin Dispersion of Surface-coated Silica Particles

PRODUCTION EXAMPLE 8

214 parts by weight of a surface-coated silica particle dispersion as obtained in Production Example 1, 100 parts by weight of an alicyclic epoxy resin (manufactured by Daicel Chemical Industries, Ltd., trade name "Ceroxide 2021P", 3,4-epoxycyclohexylmethyl-3',4'-epoxycyclohexane carboxylate), and 47 parts by weight of isopropyl alcohol were introduced into a round-bottomed flask equipped with a magnetic stirrer, a condenser and a thermometer, and stirred at room temperature for 1 hour to disperse surface-coated silica particles in the alicyclic epoxy resin. Finally, isopropyl alcohol was distilled off at 40° C. at 50 hPa to give 143 parts by weight of an epoxy resin dispersion of surface-coated silica particles.

PRODUCTION EXAMPLES 9 to 14

Epoxy resin dispersions of surface-coated silica particles were obtained in the same manner as in Production Example 8 except that the type and the amount of surface-coated silica particle dispersion used in Production Example 8 were changed as shown in Table 2.

Table 2 shows the type and the amount of the surface-coated silica particle dispersions used, the amount of the alicyclic epoxy resin (manufactured by Daicel Chemical Industries, Ltd., trade name "Ceroxide 2021P") used, and the viscosity of epoxy resin dispersions of surface-coated silica particles. The viscosity of epoxy resin dispersions of surface-coated silica particles is an indicator of dispersion stability. In the table, the amount of each component used is given in part by weight.

TABLE 2

| Production Example | 8 | 9 | 10 | 11 | 12 | 13 | 14 |
|---|---|---|---|---|---|---|---|
| Dispersion of Production Ex. 1 | 214 | | | | | | |
| Dispersion of Production Ex. 2 | | 292 | | | | | |
| Dispersion of Production Ex. 3 | | | 168 | | | | |
| Dispersion of Production Ex. 4 | | | | 212 | | | |
| Dispersion of Production Ex. 5 | | | | | 214 | | |
| Dispersion of Production Ex. 6 | | | | | | 214 | |
| Dispersion of | | | | | | | 214 |

TABLE 2-continued

| Production Example | 8 | 9 | 10 | 11 | 12 | 13 | 14 |
|---|---|---|---|---|---|---|---|
| Production Ex. 7 Alicyclic epoxy resin | 100 | 100 | 100 | 100 | 100 | 100 | 100 |
| Viscosity of epoxy resin dispersion of surface-coated silica particles (mPa·s) | 1200 | 25000 | 500 | 1600 | 8000 | 25000 | 35000 |

Preparation of Optical Semiconductor Encapsulating Composition

EXAMPLES 1 to 6 AND COMPARATIVE EXAMPLES 1 to 3

As shown in Table 3, each component was mixed to prepare optical semiconductor encapsulating compositions.

TABLE 3

|  | Example | | | | | | Comp. Ex. | | |
|---|---|---|---|---|---|---|---|---|---|
|  | 1 | 2 | 3 | 4 | 5 | 6 | 1 | 2 | 3 |
| Dispersion of Production Ex. 8 | 50 | 66 | 100 |  |  |  |  |  |  |
| Dispersion of Production Ex. 9 |  |  |  |  |  |  | 50 |  |  |
| Dispersion of Production Ex. 10 |  |  |  |  |  |  |  | 50 |  |
| Dispersion of Production Ex. 11 |  |  |  | 50 |  |  |  |  |  |
| Dispersion of Production Ex. 12 |  |  |  |  | 50 |  |  |  |  |
| Dispersion of Production Ex. 13 |  |  |  |  |  | 50 |  |  |  |
| Dispersion of Production Ex. 14 |  |  |  |  |  |  |  |  | 50 |
| Alicyclic epoxy resin | 65 | 54 | 30 | 65 | 65 | 65 | 65 | 65 | 65 |
| Carboxylic anhydride curing agent | 130 | 130 | 130 | 130 | 130 | 130 | 130 | 130 | 130 |
| Curing accelerator | 1 | 1 | 1 | 1 | 1 | 1 | 1 | 1 | 1 |

In Table 3, the amount of each component used is given in part by weight. "Ceroxide 2021P" (trade name, manufactured by Daicel Chemical Industries, Ltd.) was used as the alicyclic epoxy resin. The carboxylic anhydride curing agent refers to methylhexahydrophthalic anhydride (manufactured by Hitachi Chemical Co., Ltd., trade name "HN-5500E"). The curing accelerator refers to tetra-n-butylphosphonium o,o-diethylphosphorodithioate (manufactured by Nippon Chemical Industrial Co., Ltd., trade name "PX-4ET").

Table 4 shows the proportion of each component in the optical semiconductor encapsulating compositions of Examples 1 to 6 and Comparative Examples 1 to 3. In Table 4, the amounts of the surface-coated silica particles indicate values calculated based on the weight of the residue after distilling off the solvent from the dispersions of the particles obtained in Production Examples 1 to 7.

TABLE 4

|  | Example | | | | | | Comp. Ex. | | |
|---|---|---|---|---|---|---|---|---|---|
|  | 1 | 2 | 3 | 4 | 5 | 6 | 1 | 2 | 3 |
| Alicyclic epoxy resin | 100 | 100 | 100 | 100 | 100 | 100 | 100 | 100 | 100 |
| Carboxylic anhydride curing agent | 0.96 | 0.95 | 0.93 | 0.96 | 0.96 | 0.96 | 0.99 | 0.94 | 0.96 |
| Curing accelerator | 0.97 | 0.95 | 0.93 | 0.96 | 0.97 | 0.97 | 0.99 | 0.95 | 0.97 |
| Surface-coated silica particles | 11.0 | 14.4 | 21.3 | 10.9 | 11.0 | 11.0 | 14.3 | 8.9 | 11.0 |

In Table 4, the amounts of the alicyclic epoxy resin, the curing accelerator, and the surface-coated silica particles are given in part by weight of solids. Moreover, the amount of the carboxylic anhydride curing agent is the equivalent of the curing agent per equivalent of the alicyclic epoxy resin.

The optical semiconductor encapsulating compositions obtained in the Examples and the Comparative Examples were each evaluated according to the following methods. Note that, of the composition of Comparative Example 3, the viscosity of the epoxy resin dispersion of the surface-coated silica particles was as high as 30000 mPas or greater, and the workability of the composition during the preparation of a cured product was extremely poor and thus no cured product could be prepared.

Light Transmittance

A plate-shaped cured product having a thickness of 2 mm was prepared from each optical semiconductor encapsulating composition. Curing was performed by heating at 110° C. for 3 hours and further heating at 130° C. for 3 hours. The light transmittance of the cured products at a wavelength of 470 nm was measured using an ultraviolet-visible spectrophotometer (trade name "UVmini-1240", manufactured by Shimadzu Corporation).

Heat Cycle Resistance

Each of the optical semiconductor encapsulating compositions was casted into a square-shaped LED lamp housing (length: 7 mm, width: 5 mm, thickness: 2 mm) furnished with a LED chip and a lead frame, and thermally cured to give an optical semiconductor device. Curing was performed by heating at 110° C. for 3 hours and further heating at 130° C. for 3 hours. The resulting LED lamps were introduced into a heat cycle tester (trade name "THERMAL SHOCK CHAMBER NT500", manufactured by Kusumoto Chemicals Co., Ltd.), and the heat cycle resistance was evaluated under the following conditions.

Evaluation conditions: A 100-cycle thermal shock test was performed, with 1 cycle consisting of −40° C. for 30 min and 110° C. for 30 min, and then crack generation in the encapsulating resin of each LED lamp was examined. The state of crack generation was classified for inspection into two categories, i.e., large cracking and small cracking. Large cracking means that an encapsulating resin was cracked entirely, and small cracking means that the periphery of the metal part in an encapsulating resin had a small crack. The test results are presented by the number of samples out of 20 samples that produced large cracking or small cracking.

Table 5 shows the test results.

TABLE 5

|  |  | Example | | | | | | Comp. Ex. | | |
| --- | --- | --- | --- | --- | --- | --- | --- | --- | --- | --- |
|  |  | 1 | 2 | 3 | 4 | 5 | 6 | 1 | 2 | 3 |
| Light transmittance (%) | | 91 | 90 | 91 | 92 | 92 | 87 | 90 | 88 | — |
| Heat cycle resistance | Number of large cracks | 0 | 0 | 0 | 0 | 0 | 0 | 3 | 2 | — |
|  | Number of small cracks | 0 | 0 | 0 | 0 | 0 | 4 | 10 | 11 | — |

The invention claimed is:

1. An optical semiconductor encapsulating composition comprising:
    (A) an epoxy compound,
    (B) a carboxylic anhydride curing agent,
    (C) a curing accelerator, and
    (D) surface-coated silica particles having an average particle diameter of 5 to 50 nm in which 0.2 to 3 mmol of a silane coupling agent (D2) that contains an epoxy group-containing silane coupling agent (d1) is reacted with 1 g of silica particles (D1) to surface-coat the silica particles, the epoxy group being converted into a hydroxyl group through ring opening.

2. The optical semiconductor encapsulating composition according to claim 1, wherein the component (A) is an alicyclic epoxy resin.

3. The optical semiconductor encapsulating composition according to claim 1, wherein the silane coupling agent (D2) comprises the epoxy group-containing silane coupling agent (d1) in a proportion of 20 to 100 mol %.

4. The optical semiconductor encapsulating composition according to claim 1, wherein the reaction of the silica particles (D1) and the silane coupling agent (D2) is performed under an acidic condition.

5. The optical semiconductor encapsulating composition according to claim 1, wherein the amount of the component (B) is such that the equivalent of the component (B) per equivalent of the component (A) is 0.5 to 1.5 eq.

6. The optical semiconductor encapsulating composition according to claim 1, wherein the amount of the component (C) is 0.01 to 8.0 parts by weight per 100 parts by weight of the component (A).

7. The optical semiconductor encapsulating composition according to claim 1, wherein the amount of the component (D) is 3 to 70 parts by weight per 100 parts by weight of the component (A).

8. The optical semiconductor encapsulating composition according to claim 1 for use in a light emitting diode chip optical semiconductor.

9. An optical semiconductor device comprising an optical semiconductor encapsulated with the optical semiconductor encapsulating composition of claim 1.

10. The optical semiconductor device according to claim 9 comprising a light emitting diode chip optical semiconductor.

* * * * *